United States Patent [19]

Fan et al.

[11] Patent Number: 4,547,622

[45] Date of Patent: Oct. 15, 1985

[54] SOLAR CELLS AND PHOTODETECTORS

[75] Inventors: John C. C. Fan, Chestnut Hill; Ronald P. Gale, Bedford, both of Mass.

[73] Assignee: Massachusetts Institute of Technology, Cambridge, Mass.

[21] Appl. No.: 604,922

[22] Filed: Apr. 27, 1984

[51] Int. Cl.$^4$ ............................................. H01L 31/06
[52] U.S. Cl. ............................................. 136/249; 136/255; 136/258; 136/259; 136/262; 357/16; 357/30
[58] Field of Search ............... 136/255, 258 AM, 259, 136/249 TJ, 262; 357/16, 30

[56] References Cited

U.S. PATENT DOCUMENTS

| | | | |
|---|---|---|---|
| 3,675,026 | 7/1972 | Woodall | 250/211 |
| 3,982,265 | 9/1976 | Johnston, Jr. | 357/30 |
| 4,227,941 | 10/1980 | Bozler et al. | 136/255 |
| 4,416,052 | 11/1983 | Stern | 29/572 |
| 4,427,841 | 1/1984 | Rahilly | 136/255 |
| 4,442,310 | 4/1984 | Carlson et al. | 136/256 |

OTHER PUBLICATIONS

Hovel et al., 12th IEEE Photovoltaic Specialists Conf., 1976 Institute of Electrical Electronic Engineers, NY, pp. 945-947.
Fan et al., Appl. Phys. Lett. 32, 390 (1978).
Bozler et al., Inst. Phys. Conf. Ser. No. 45: Chapter 5, (1979) "Efficient GaAs Shallow-Homojunction Solar Cells on Ge Substrates", pp. 429-436.
"A High-Efficiency GaAlAs Double-Heterostructure Photovoltaic Detector," Appl. Phys. Lett. 33(8), Oct. 15, 1978, Miller et al., pp. 721-723.
"GaAs Double-Heterostructure Photodetectors", Journal of Applied Physics, vol. 48, No. 8, Aug. 1977, Merz et al., pp. 3580-3587.
"The Metal Interconnected Cascade Solar Cell", Conf. Record, 16th IEEE Photo-Voltaic Specialists Conf. (1982), pp. 228-230.
Mandelkorn et al., Conference Record 9th IEEE Photovoltaic Spec. Conf. (IEEE, New York 1973), pp. 66-71.
"Concentration Dependence of the Absorption Coefficient for n- and p-type GaAs Between 1.3 and 1.6 eV, Journal of Applied Physics, vol. 46, No. 1, Jan. 1975, Casey et al., pp. 250-257.

Primary Examiner—Aaron Weisstuch
Attorney, Agent, or Firm—Arthur A. Smith, Jr.; Leo R. Reynolds

[57] ABSTRACT

An improved photovoltaic device in which a charge separation junction is provided over a charge confining heterojunction. The charge separation junction is a junction formed of an n+-doped direct bandgap layer on a p-doped direct bandgap active layer. The charge confining heterojunction is formed by the interface of the active layer with a Back Surface Layer (BSL) of higher bandgap material than the active layer to provide a Back Surface Field (BSF). The percentage of Al in the layers may vary from Y=O to x≦0.42. The structure applies to both crystalline and amorphous material.

11 Claims, 7 Drawing Figures

SOLAR CELLS AND PHOTODETECTORS

GOVERNMENT SPONSORSHIP

Work relating to this invention was supported by the United States Air Force and SERI.

TECHNICAL FIELD

This invention is in the field of photovoltaic devices, including solar cells.

BACKGROUND ART

Solar cells have been developed for generating electrical energy directly from sunlight. In general, these cells can be classified as either heterojunction devices or homojunction devices. Heterojunctions are those formed between two different semiconductor materials or between a metal and a semiconductor or from a metal/insulator/semiconductor sandwich. Homojunction devices depend only upon junctions formed between layers of the same semiconductor material doped with different impurities to provide different electrical properties.

Heretofore, homojunction cells using direct-gap semiconductor materials have generally exhibited disappointing efficiencies. Direct-gap materials are strongly photon absorbing semiconductor materials from the III-IV group. One reason for the relatively low efficiencies in homojunction solar cells is believed to be the high absorption coefficient which is inherent in direct gap semiconductor materials such as gallium arsenide. For example, approximately half of the carriers due to AM 1 radiation are generated within 0.2 $\mu$m of the surface of gallium arsenide. Therefore, for materials such as GaAs, which also has a high surface recombination velocity, most of the carriers generated by solar radiation recombine at the top layer before they reach the charge separation junction, causing a significant decrease in conversion efficiency.

HETEROFACE

One approach which has been used to overcome this problem has been the use of a thin window layer of gallium aluminum arsenide ($Ga_{1-x}Al_xAs$/GaAs) grown over the GaAs wafer by liquid phase epitaxy. Such cells may be referred to as heteroface cells. Because the recombination velocity is much less at a $Ga_{1-x}Al_xAs$/GaAs interface than at a GaAs surface, higher conversion efficiencies have been achieved. Thus Hovel and Woodall report conversion efficiencies of up to 22% for $Ga_{1-x}Al_xAs$/GaAs heteroface solar cells but only up to 14% for GaAs homojunction solar cells for air mass 1 (AM 1) radiation. See Hovel and Woodall, J.M., *Proc. 12th IEEE Photovoltaic Specialists Conf.*, 1976 (Institute of Electrical and Electronic Engineers, New York, 1976), p. 945.

SHALLOW HOMOJUNCTION

A second approach using a different cell structural strategy that eliminates the $Ga_{1-x}Al_xAs$ layer completely has produced conversion efficiencies as high as 21 percent at AM1 for GaAs cells on single-crystal substrates of GaAs [see J. C. C. Fan, C. O. Bozler, and R. L. Chapman, *Appl. Phys. Lett.* 32, 390 (1978)] and Ge [C. O. Bozler, J. C. C. Fan, and R. W. McClelland, *Inst. Phys. Conf. Ser.* 45,429 (1979)]. The structure is built around an $n^+$-p junction (a + sign denotes relatively heavy doping levels). The top layer, of heavily doped $n^+$ GaAs, is very shallow—generally less than 0.1 micrometer thick—so that most photons are absorbed in the main active p-layer beneath. Photogenerated carriers created in the main active p-layer thus avoid the large population of recombination centers in the top $n^+$ surface. This strategy, successful for single-crystal cell, is now being used to fabricate efficient thin-film cells which are potentially low-cost and provide high conversion efficiencies. To obtain high open-circuit voltage in this structure, a back-surface field (BSF) was formed by a lower $p^+$ GaAs back-surface layer (BSL). Therefore, the shallow homojunction structure is an $n^+/p/p^+$ structure, with two homojunctions, a $n^+/p$ charge separation junction, and a $p/p^+$ charge confining junction [see C. O. Bozler, R. L. Chapman, J. C. C. Fan, and R. W. McClelland, U.S. Pat. No. 4,227,941 (1980)].

HETEROJUNCTION

A third approach to the problem of improved conversion efficiencies in solar cells is described in U.S. Pat. No. 3,982,265 to Johnston, Jr. In the Johnston device, an n-type high-bandgap AlAs layer is deposited on a p-type charge separation GaAs layer to form a charge separation heterojunction.

DOUBLE-HETEROSTRUCTURE

A further development is shown in an article by R. C. Miller et al. *Appl. Phys. Lett.* 33 721 (1978). A GaAlAs photovoltaic detector is described comprising a four layer GaAlAs double-heterostructure in which an antireflection-coated hole is etched into a GaAs substrate on the top surface and a restricted-area reflective contact of Ti-Pt is provided on the bottom surface.

The aluminum fraction of the four GaAlAs layers is varied from top to bottom as follows:
Layer 1—36%
Layer 2—24%
Layer 3—0%
Layer 4—24%

The fourth or bottom layer with 24% Al is said to present a 168-mV high diffusion barrier at its interface with the active region, efficiently reflecting electrons back toward the p-n heterojunction (between layer 2 and 3) for collection. [See also Merz et al. *Journal Appl. Phys.*, 48 3580 (1977) and LaRue et al. *Proc. 16th IEEE Photovoltaic Specialists Conf.* 228 (1982) for similar structures].

Despite the extensive activity in the field and the long-felt need for the foregoing improvements in solar cell conversion efficient structures, a need exists for even better conversion efficiency than is available in prior art structures of the type described above. Even improvements of 1-2% may have a substantial impact on whether a solar cell application may be practical.

DISCLOSURE OF THE INVENTION

An improved solar cell or photo-cell is provided comprising a two-junction cell structure formed of three layers of semiconductor material, a first top layer, a second intermediate layer and a third bottom layer. The junction between the first and second layers is the charge separation junction and the region defined by the second intermediate layer comprises the main active layer. The first junction is preferably a shallow-homojunction structure formed of GaAs material. The second junction is a charge confining heterojunction of GaAs/Ga$_{1-x}$Al$_x$As wherein x is less than about 0.42. Above x≅0.42 to 0.45 the Ga$_{1-x}$Al$_x$As becomes indirect bandgap material which will create undesirable effects in the back surface field and also cause increased difficulty in doping the GaAlAs layer. The Ga$_{1-x}$Al$_x$As layer forms a back surface field of a material having a higher energy gap (Eg) than the active layer material, i.e., Eg of GaAs≅1.43 eV whereas Eg of AlAs≅2.2 eV, therefore, the added percentage of AlAs results in a higher energy gap in the Ga$_{1-x}$Al$_x$As layer. Preferably the BSL layer will have an energy gap Eg equal to or less than about 2 eV.

As will be explained in detail, this difference in energy gap results in a significant improvement in the charge separation properties of the second junction and hence the overall efficiency of the device.

BEST MODE OF CARRYING OUT THE INVENTION

Figure 1:
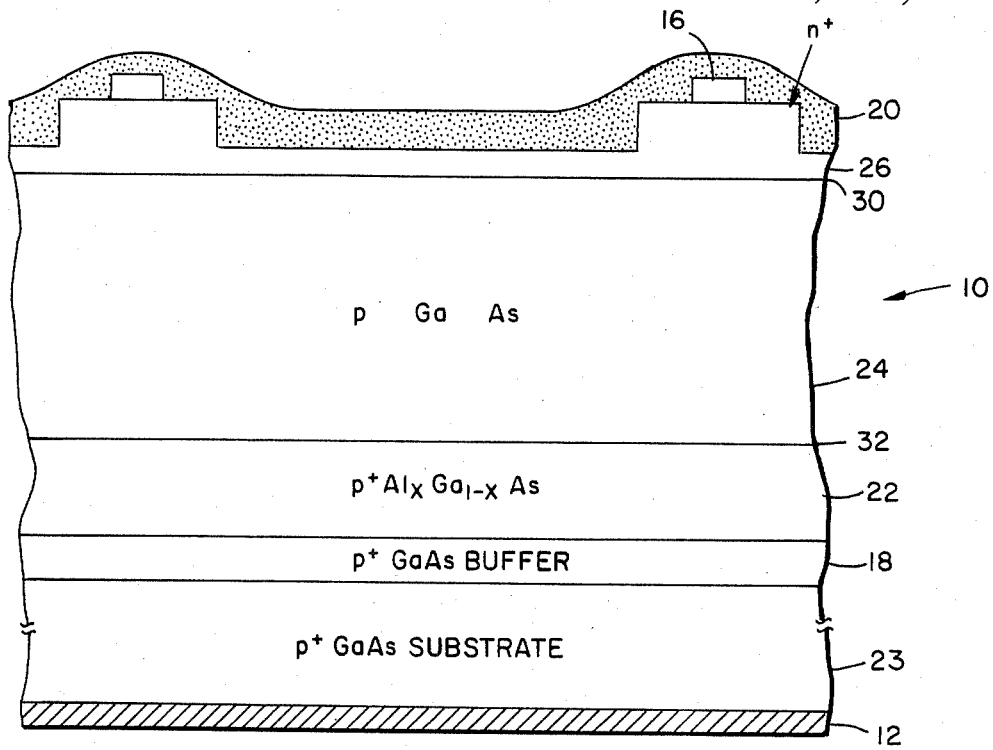
FIG. 1 is a schematic drawing of a first embodiment of a shallow-homojunction solar cell with a homostructure BSF in accordance with the invention.

The invention will now be described with particular reference to the Figures. A schematic cross section of a solar cell embodiment of the invention is shown generally in FIG. 1.

Cell 10 is formed of a plurality of layers of semiconductor III–IV material formed on a substrate 23. Substrate 23 is formed from a wafer of single crystal p+ GaAs The p+ dopants may comprise well known p+ dopant elements such as zinc, cadmium, beryllium, or manganese. The p+ carrier concentration is about $10^{18}$ carriers per cm$^2$. The thickness of substrate 23 is not critical and may be about 1 to 500 μm.

An optional epitaxial p+ GaAs buffer layer 18 of about 4–5 μm thick is formed on the top surface of substrate 23 in a horizontal OM (organometallic) CVD reactor employing hydrogen as the carrier gas and trimethylgallium and arsine as the source gases. Dimethylzinc is used as the p+ dopant source.

Next, an epitaxial Back Surface Layer (BSL) 22 of p+ Al$_x$Ga$_{1-x}$As is formed as above in an OM CVD reactor. Trimethylaluminum is used as the Al source gas. Layer 22 is preferably about 0.5 μm thick.

An active layer 24 of p GaAs about 4.5 μm thick and preferably in the range of between 1–5 μm thick is then formed as above on the BSF layer 22. Layer 24 is doped to a carrier concentration of about $10^{14}$–$10^{18}$ cm$^{-3}$.

Layer 26 of n+ GaAs is epitaxially deposited upon layer 24 to form a shallow-homojunction 30 at the interface. It is important that ultimately layer 26 be limited in thickness to 0.15 um or less to allow sufficient carrier generation in active layer 24. Suitable n-type dopants may be provided by sulphur, silicon, selenium, or tin gas sources. In particular, hydrogen selenide was substituted for the dimethylzinc p-type dopant gas in the previous steps. The n+ carrier concentration of layer 26 is preferably greater than $10^{18}$ carriers/cm$^3$.

A contact grid 16 is formed on layer 26 by depositing an evaporated Au film patterned by well-known masking techniques. Back contact 12 was formed by electroplating Au on substrate 23.

The non-metallized regions of the n+ GaAs layer 26 are then thinned to about 500 Angstroms by alternating anodic oxidation and oxide (etching) removal steps.

Lastly, a native oxide or a deposited oxide coating is poured over the cell to form an antireflection AR coating 20 having a refraction index at 6328 Angstroms of about 1.8 to 2.0. Cell areas of 0.095–0.51 cm$^2$ were then defined by conventional mesa fabrication techniques.

The resultant structures 10 provides a highly efficient cell of relatively inexpensive manufacturing design, as will be explained below.

Figure 2:
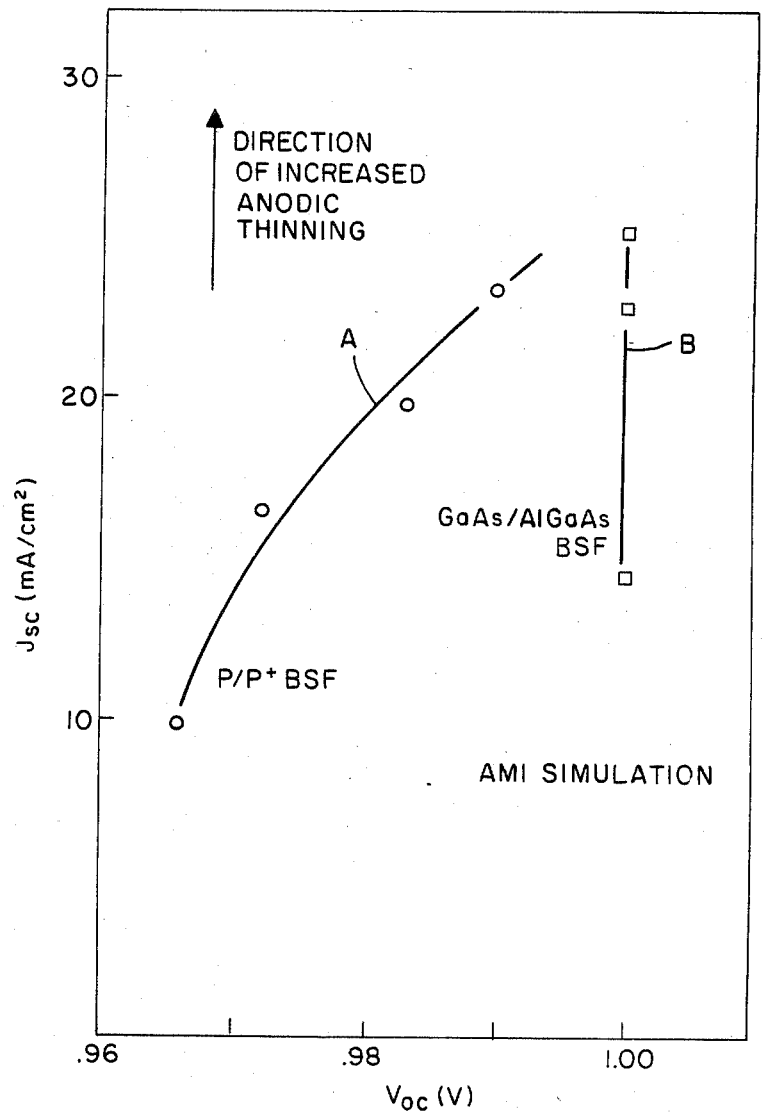
FIG. 2 is a plot of open-circuit voltage as a function of short-circuit current for a heterostructure BSF and conventional cells under AM1 illumination at various stages of n+ anodic thinning.

FIG. 2 is a graph in which open circuit voltage $V_{oc}$ is plotted as a function of short-circuit current density ($J_{sc}$) before and during the n+ GaAs layer thinning process described above. Plot B is the curve for a heterostructure BSF cell 10 of the present invention and Plot A shows the curve for a conventional shallow-homojunction cell of the type described in U.S. Pat. No. 4,227,941. The latter cell, which is typical of high-efficiency GaAs cells we have previously made, shows a steady increase in $V_{oc}$ as $J_{sc}$ is increased with each successive anodization/stripping step. The heterostructure BSF cell of the invention, however, exhibits no noticeable change in $V_{oc}$ in spite of a 70% increase in $J_{sc}$.

These results indicate that the heterostructure BSF cell 10 has lower leakage current and thus provides a better BSF than the conventional shallow-homojunction cell.

Figure 3:
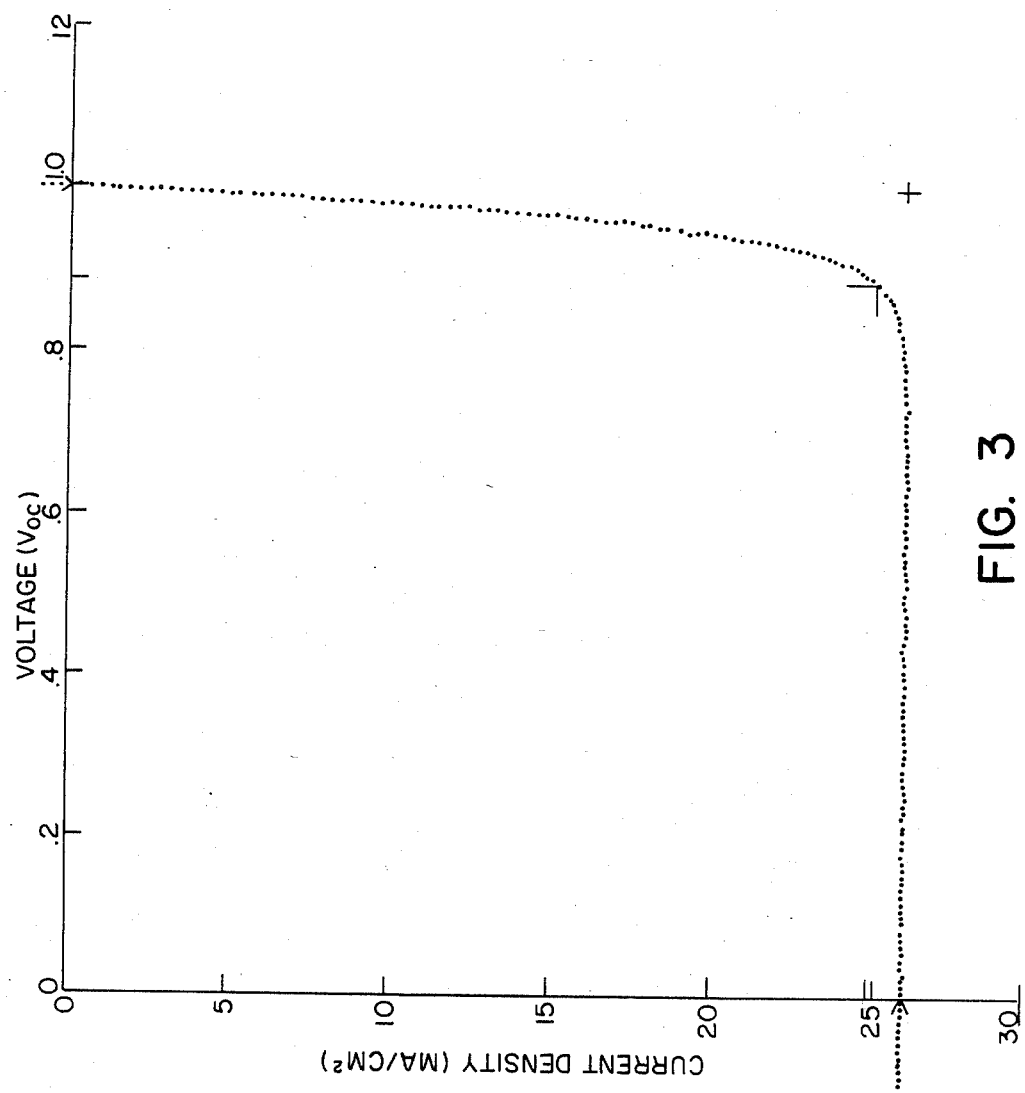
FIG. 3 is a plot of photocurrent as a function of voltage for a GaAs cell with a heterostructure BSF.

FIG. 3 shows the current-voltage curve under simulated AM1 conditions, adjusted to a rooftop calibration for one of the best 0.52-cm$^2$ heterostructure BSF cells made in accordance with the invention. For this curve $V_{oc}$ is 1.00 V, $J_{sc}$ is 25.6 mA/cm$^2$, and the fill factor ff is 0.85, giving an AM1 efficiency of 21.9%. This efficiency is the highest reported for a solar cell with a single-layer AR coating. Previously, our best conventional GaAs shallow-homojunction cell yielded a $V_{oc}$ of 0.98 V, a $J_{sc}$ of 25.5 mA/cm$^2$, and a fill factor of 0.81, resulting in an AM1 efficiency of 20.0%.

In addition, we have fabricated cells using a double AR coating of magnesium flouride (MgF$_2$) and zinc sulfide(ZnS). Such cells prove to have a 23% efficiency at AM1 under 1-sun illumination.

Figure 4:
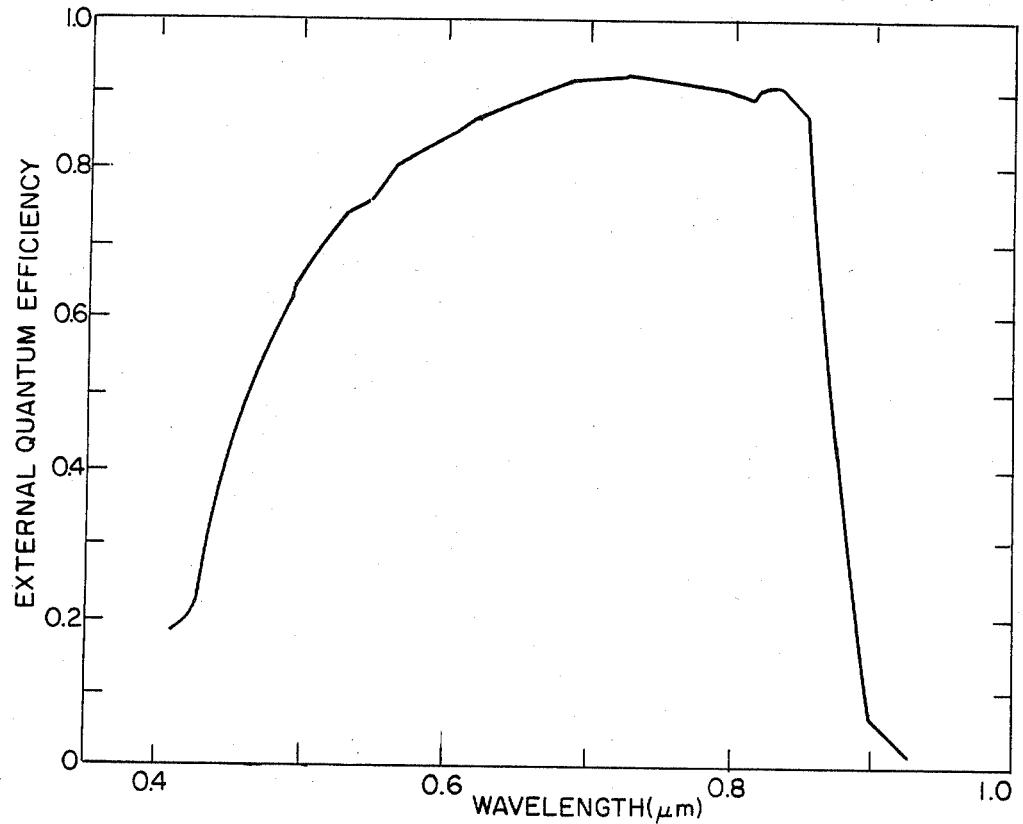
FIG. 4 is a plot of external quantum efficiency as a function of wavelength for the cell of FIG. 3.

The external quantum efficiency of the single AR coated cell described in connection with FIG. 3 above is plotted as a function of wavelength in FIG. 4. The efficiency values are slightly better than those previously measured for the best conventional GaAs cells. However, the differences are small enough to be caused by differences in the anodic AR coating or n+ layer thickness. Because of these variable factors, we have not yet established with certainty that the heterostructure BSF cell of the invention produces an improvement in photocurrent over the conventional shallow homojunction cell, which has a p/p+ BSF. However, it is clear that the heterostructure BSF causes the observed improvement in $V_{oc}$ and ff.

The cell structure shown in FIG. 1 may be seen to comprise a charge separation shallow-homojunction 30 and a charge confining heterojunction 32. The active region is provided by p GaAs layer 24. The BSF is provided by $Al_xGa_{1-x}As$ layer 22. The percentage atomic weight "x" of Al is critical for a variety of reasons. Too much Al will produce undesirable lattice mismatch at the charge confining heterojunction 32. Too little Al will not produce a sufficiently high bandgap voltage Eg difference between active layer 24 and the BSL 22. More importantly, as previously discussed, at $x \approx 0.42$ to 0.45 the AlGaAs BSL becomes indirect bandgap material.

Figure 5:
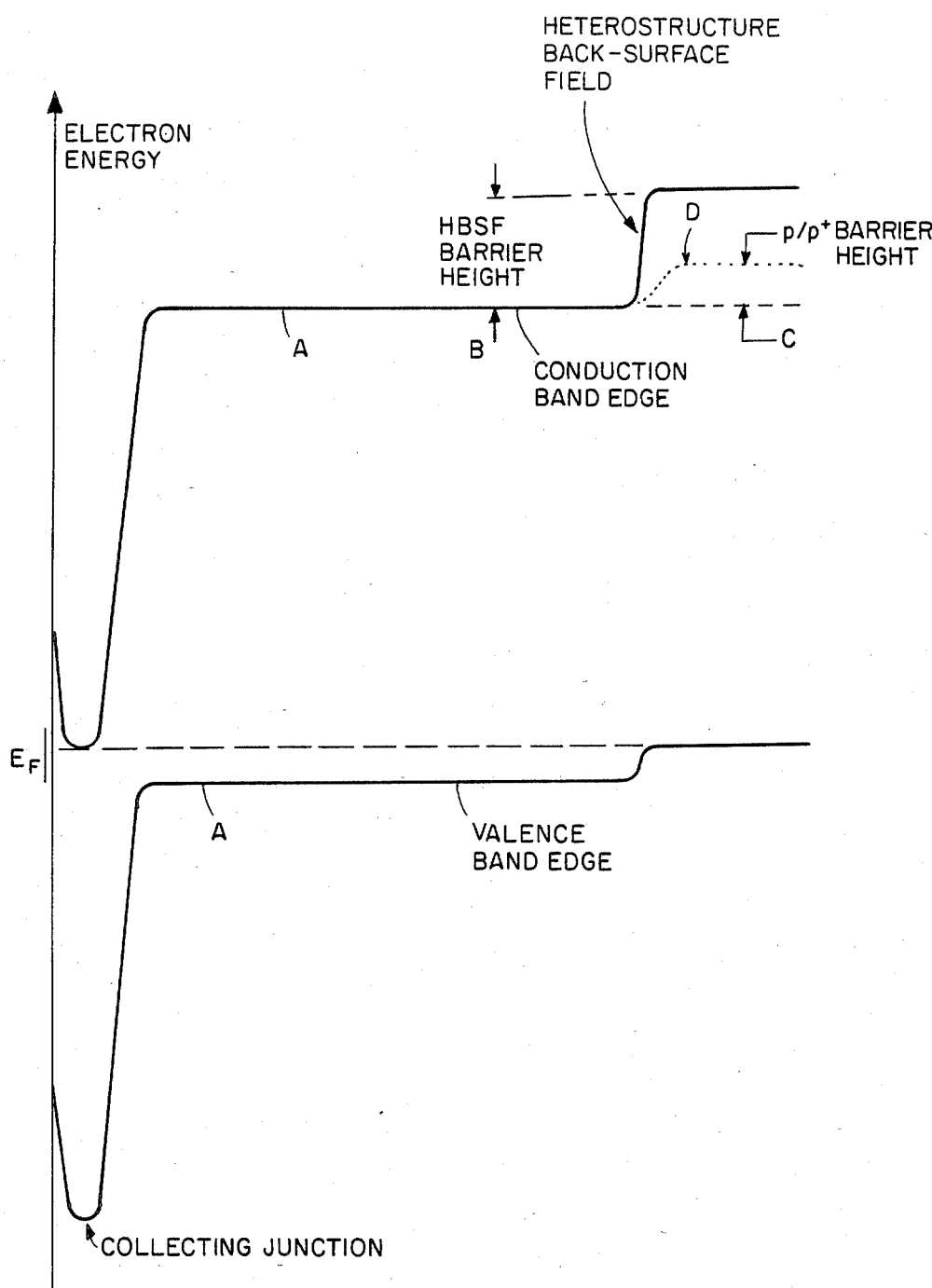
FIG. 5 is a schematic energy band diagram of n+/p/p+ shallow-homojunction solar cell with a heterostructure back-surface field and a similar plot for a conventional shallow homojunction structure.

In the devices described in connection with the curves of FIGS. 2 and 3, a range of 0.05 to 0.42 is recommended. Preferably, the Al content "x" of layer 22 should be about 0.2. This produces a BSF which acts as a minority-carrier mirror at heterojunction 32. The effective back-surface recombination velocity is thereby reduced, increasing the collected current and the cell voltage. Previously a BSF has been incorporated into Si and GaAs solar cells by using an n/n+ or p/p+ doping profile [J.Mandelkorn and J. H. Lamneck, Jr., *Conference Record 9th IEEE Photovoltaic Specialists Conference,* Silver Spring (IEEE, New York, 1973), p. 66; C. O. Bozler, J. C. C. Fan, and R. W. McClelland, *Proceedings* 7th International Symposium on GaAs and Related Compounds, St. Louis, 1978 (Institute of Physics and Physical Society, London, 1979), p. 429]. For the doping used in the Si and GaAs cells, the Fermi level differences, which give rise to the BSF, were approximately 0.2 and 0.1 eV, respectively. In the present invention, the barrier height is increased, as previously described, to improve charge confinement, by incorporating a heterostructure formed by using p+ $Al_xGa_{1-x}As$ material of larger bandgap. The energy band diagram of an ideal n+/p/p+ heterostructure BSF is shown schematically in curve A of FIG. 5 in solid lines. The energy band diagram of an ideal shallow homojunction conventional structure is superimposed on curve A with the dotted line of curve D showing the difference between the two structures. The contribution to the effective barrier height B (in FIG. 5) by the bandgap difference (which is B minus C) can be several times larger than the barrier height C due merely to the difference in doping. Since the BSF is the gradient of the barrier height, the effectiveness of the heterostructure BSF over the conventional homostructure is enhanced because the interface between materials of different bandgaps can be made more abrupt than merely utilizing the doping profile.

For non-tandem single cells, (such as in FIG. 1), the active layer should optimally have an energy gap of about 1.4 eV to 1.6 eV. $Ga_{1-y}Al_yAs$ with $y \leq 0.10$ would be ideal, and with a $Ga_{1-x}Al_xAs$ BSC layer of $0.15 \leq x \leq 0.42$. For two-cell tandem structures, the active layer should have an energy gap of 1.7 to 1.8 eV with $y = 0.25$ to 0.35 and $x \leq 0.42$ eV.

Figure 6:
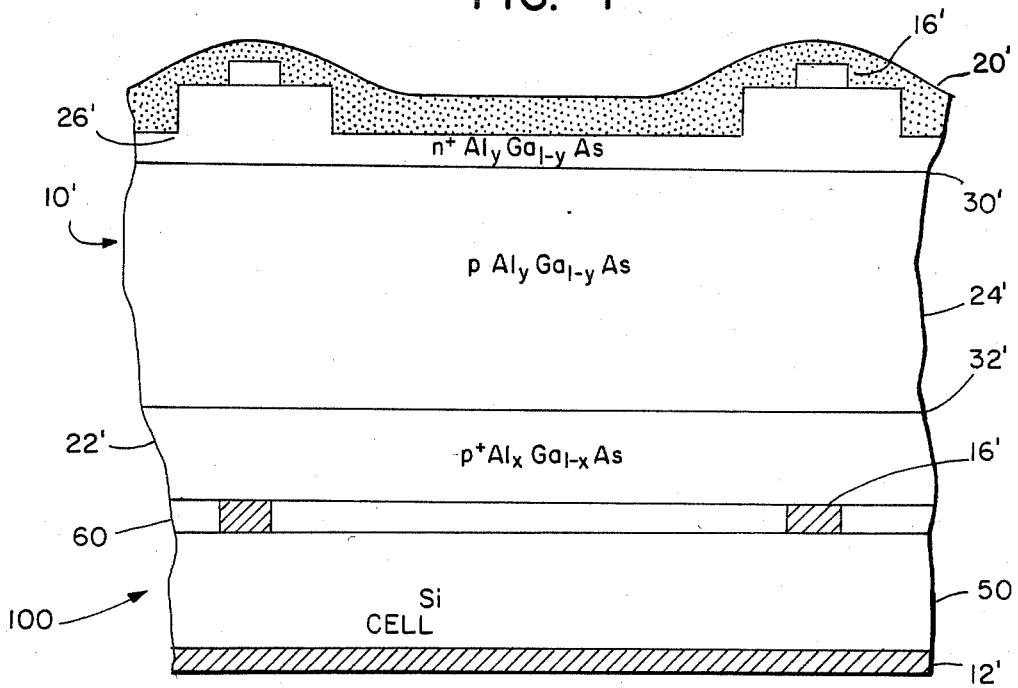
FIG. 6 is a schematic cross section of a tandem structure made in accordance with the invention.

Referring now to FIG. 6, a tandem cell embodiment will be described. Note that in FIG. 6, numeral designations for corresponding parts in FIG. 1 bear like numerals and similar parts carry a prime suffix. The heterostructure BSF cell structure of the invention is well suited to high-efficiency tandem structures with an AlGaAs upper cell 10', and, for example, a conventional Si lower cell 100, as shown in FIG. 6. In vapor growth systems, such as CVD, the change in Al content is as easily executed as a change in doping level. The higher bandgap AlGaAs layer 22' in cell 10' not only provides the BSF but also acts as a rear window to maximize the transmission of light to the Si layer 50 in lower cell 100. This structure was employed to fabricate 1.8 eV bandgap AlGaAs solar cells with conversion efficiencies over 16% AM1.

In tandem structures, solar cells 10 and 100 with different energy gaps are stacked in tandem so that cell 10' facing the sun has the largest energy gap. This top cell 10 absorbs the incident photons with energies equal to or greater than its energy gap and transmits the less energetic photons with energies equal to or greater than its energy gap and transmits the rest downward in the stack, etc. It is essential that solar photons that do not contribute significantly to the photocurrent in the top cell should not be absorbed by the top cell. In the conventional prior art shallow homojunction structure, the p+ GaAs BSF layer does not contribute significantly to the photocurrent, but forms a reasonably good back surface field, will absorb a substantial number of solar photons, instead of transmitting them to the lower. Furthermore, in heavily-doped layers (such as n+ or p+), the bandgap often narrows down, [see H. C. Casey, D. D. Sell, and K. W. Wecht, *J. Appl. Phys.* 46, 250(1974)] thus worsening this absorption problem. In the new structure shown in FIG. 6, the $Ga_{1-x}Al_xAs$ BSL layer 22' will have a larger bandgap, thus forming a window ideal for tandem structures. Similarly, the n+ layer may also be replaced by a n+ $Ga_{1-z}Al_zAs$ layer forming a heterojunction window.

As may be seen in FIG. 6, a homojunction 30' is formed at the interface between the n+ of $Al_yGa_{1-y}As$ layer 26' and the p $Al_yGa_{1-y}As$ layer 24'. Junction 30' is a charge separation junction. A charge confinement heterojunction 32' is formed at the interface between layer 24' and BSL layer 22'. BSL layer 22' is formed of p+ $Al_xGa_{1-x}As$. Preferably "x" is less than or equal to 0.42 and x−y is greater than 0.05 to result in a lattice matched structure within a BSL layer of larger bandgap than the active layer. The structure shown in FIG. 6 may be advantageously formed using the CLEFT process described below to separate the film layers from the GaAs substrate of FIG. 1.

An optional AR coating 60 may be formed over the grid contacts 16' formed on conventional Si cell 50. A back surface contact 12' is provided on Si cell 50.

Figure 7:
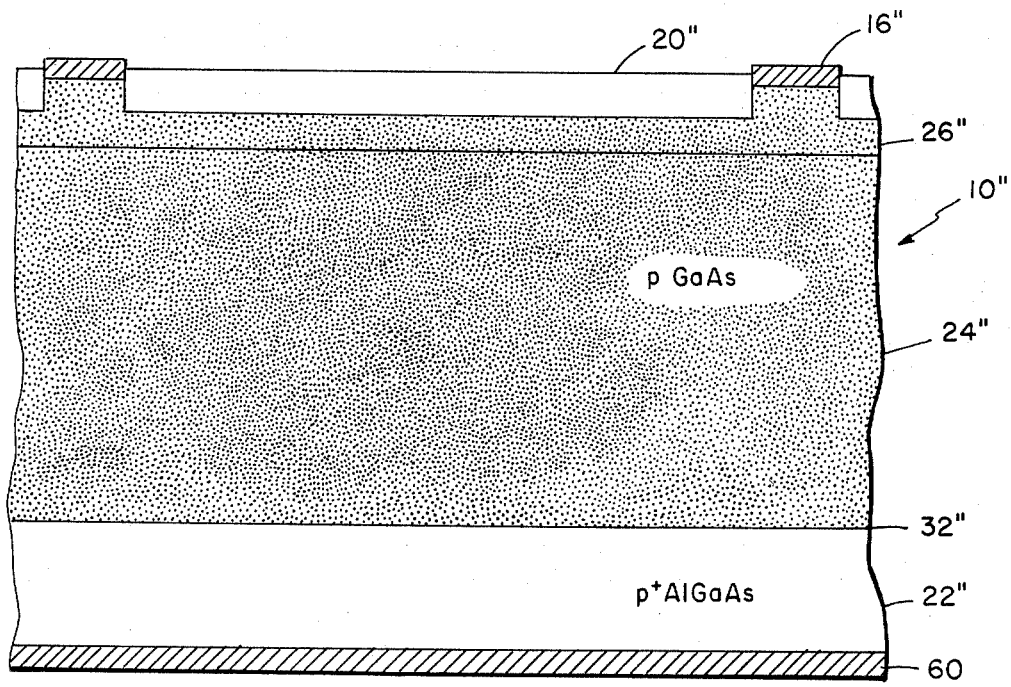
FIG. 7 is a schematic cross section of GaAs CLEFT back-surface reflector cell in accordance with the invention.

The cell structure of the invention may be advantageously used in conjunction with the CLEFT peeled-film technology described in copending U.S. patent application Ser. No. 251,214, filed Apr. 6, 1981 (a C-I-P of U.S. Ser. No. 138,891 filed Apr. 10, 1980) and incorporated herein by reference. FIG. 7 is a schematic representation of an embodiment of the invention using the CLEFT process to fabricate a back surface reflector (BSR) cell 10" that allows photons not initially absorbed in the GaAs active layer 24" to be transmitted through the p+ AlGaAs BSL layer 22" and be reflected by a highly reflecting film made of silver or aluminum or, the like, deposited on the back surface of layer 22". The reflected photons are then absorbed on the second pass through active layer 24".

This BSR structure will optionally permit the use of GaAs active layers that are half as thick as those in conventional cells but absorb the same amount of light. The BSR cells 10" should exhibit an increase in $V_{oc}$ because of the heterostructure junction 32″ and also because the dark saturation current will be reduced in the thinner GaAs layer 10″. Higher quantum efficiencies are also expected because the carriers are generated closer to the collecting junction.

Fabrication of solar cells with the BSR structure requires a technique for obtaining a thin GaAs/AlGaAs film separate from the GaAs substrate 23 of FIG. 1. Although localized etching of the substrate may be used to fabricate double-heterostructure GaAs photodetectors with a BSR [Miller et al. *Appl. Phys. Lett.* 33 721(1978)], separating layers of reasonable area from the substrate by chemical etching is both difficult and wasteful. In accordance with the present invention, the CLEFT process is used to produce lateral overgrowth on the GaAs substrate. Subsequently, the overgrowth layers 22″, 24″ and 26″ are cleaved from the substrate 23. After cleaving, the GaAs buffer layer 18 (FIG. 1) is selectively removed by etching and a metallic coating 60 is applied to the p+ AlGaAs layer 22″ to form the BSR and back ohmic contact. As an alternative to using the back metallization as a reflector, it may be desirable to apply multilayer optical coatings to selectively reflect wavelengths below the energy gap of the cell and transmits the remainder. This modification should be very useful for tandem cell structures.

It should be emphasized that in all the described structures, it is important that a BSF material be employed that presents a good lattice match with the active layer; and has a higher energy gap than the active layer. The lattice mismatch should not exceed about 0.1%. GaAs on $Ga_{1-x}Al_xAs$ wherein x is less than or equal to about 0.2 is an excellent choice for such an application. Ge on a GaAs BSL is also a good candidate. Furthermore, amorphous materials may be used in place of the epitaxial BSL layer and active layer materials since lattice matching is not a problem in amorphous materials.

Amorphous materials also exhibit different energy gaps and behave like direct bandgap material. A suitable amorphous material structure for producing a heterojunction cell with a BSL layer would be an $n^+$ $a\text{-}Si_{1-y}H_y/p$ $a\text{-}Si_{1-y}H_y/p^+a\text{-}Si_{1-x}H_x$ layered device. The percentage of H, defined by "y", would preferably be about 0.1, resulting in a bandgap of about 1.7 eV for the active layer of $p\text{-}a\text{-}Si_{1-y}H_y$ and an "x" equal to about 0.3 for a bandgap of about 1.9 eV for the BSL layer of $p^+\text{-}a\text{-}Si_{1-x}H_x$.

INDUSTRIAL APPLICATION

This invention has industrial applicability in the fabrication of solar cells.

EQUIVALENTS

Those skilled in the art will recognize, or be able to ascertain using no more than routine experimentation, many equivalents to the specific embodiments of the invention described herein. Such equivalents are intended to be encompassed by the following claims. While OMC VD is particularly suitable for mass production of epitaxial layers of GaAs and GaAlAs; other deposition techniques may be substituted therefor. Furthermore, while the percentage of Al in the layers shown and expressed as "y" has been the same in some examples given, it is understood that a different percentage "z" may be employed to construct, for example, a $n^+$ $Ga_{1-z}Al_zAs/pGa_{1-y}Al_yAs/p^+Ga_{1-x}Al_xAs$ structure with $z \geq y$ in either epitaxial or amorphous form.

Also, it should be understood that the carrier concentration of the p-doped active layer 24, while preferably of about $10^{14}$–$10^{18}$ cm$^{-3}$, as indicated previously, it is contemplated that such concentration need not be uniform throughout the layer, but may be graded.

We claim:

1. A photovoltaic device with a back surface field (BSF) comprising:
   (a) a BSL layer of p-doped direct bandgap semiconductor material;
   (b) an active layer, formed on said BSL layer, of p-doped direct bandgap semiconductor material having an energy gap Eg less than that of the BSL layer and forming a heterojunction with said BSL layer;
   (c) a shallow layer less than 0.15 μm in thickness of n-doped direct bandgap semiconductor material forming a charge separation junction with the active layer.

2. The device of claim 1 in which the lattice mismatch between the BSL layer and the active layer is less than about 0.1%.

3. The device of claim 1 in which the semiconductor material of the BSL layer is $Al_xGa_{1-x}As$ wherein $0.05 \leq x \leq 0.42$.

4. The device of claim 3 in which the thickness "t" of the active layer is about 1 to 5 μm.

5. The device of claim 1 in which the energy gap Eg of the BSL layer is equal to or less than 2.

6. The device of claim 1 including a second cell affixed to the BSL layer to form a tandem cell structure.

7. The device of claim 1 including an optical reflector formed adjacent an exposed planar surface of the BSL layer.

8. The device of claim 1 in which AlGaAs is the material used in all the layers.

9. The device of claim 1 in which the layer material is amorphous.

10. A photovoltaic device with a back surface field (BSF) comprising:
    (a) a BSL layer of $p^+$-doped direct bandgap $Al_xGa_{1-x}As$ material;
    (b) an active layer of p-doped direct bandgap semiconductor $Al_yGa_{1-y}As$ material forming a heterojunction with said BSL layer;
    (c) a layer of $n^+$-doped direct bandgap $Al_yGa_{1-y}As$ material forming a charge separation homojunction with the active layer and wherein $x \leq 0.42$, $x - y > 0.05$ and $y \geq 0$.

11. The device of claim 10 in which the lattice mismatch between the BSL layer and the active layer is less than about 0.1%.

* * * * *